US010192764B2

(12) United States Patent
Kobayashi

(10) Patent No.: US 10,192,764 B2
(45) Date of Patent: Jan. 29, 2019

(54) OVERHEAD TRANSPORT VEHICLE

(71) Applicant: MURATA MACHINERY, LTD., Kyoto-shi, Kyoto (JP)

(72) Inventor: Makoto Kobayashi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 145 days.

(21) Appl. No.: 15/421,653

(22) Filed: Feb. 1, 2017

(65) Prior Publication Data

US 2017/0243775 A1   Aug. 24, 2017

(30) Foreign Application Priority Data

Feb. 19, 2016   (JP) .................................. 2016-030177

(51) Int. Cl.
| | |
|---|---|
| *B61B 3/00* | (2006.01) |
| *B61B 13/00* | (2006.01) |
| *B61B 15/00* | (2006.01) |
| *B61D 49/00* | (2006.01) |
| *H01L 21/673* | (2006.01) |
| *H01L 21/677* | (2006.01) |
| *H01L 21/687* | (2006.01) |

(52) U.S. Cl.
CPC .......... *H01L 21/67369* (2013.01); *B61B 3/00* (2013.01); *B61B 13/00* (2013.01); *B61B 15/00* (2013.01); *B61D 49/00* (2013.01); *H01L 21/6773* (2013.01); *H01L 21/67379* (2013.01); *H01L 21/67733* (2013.01); *H01L 21/68707* (2013.01)

(58) Field of Classification Search
CPC ........... B61B 3/00; B61B 13/00; B61B 15/00; B61D 49/00; H01L 21/67369
See application file for complete search history.

(56) References Cited

U.S. PATENT DOCUMENTS

| | | | | |
|---|---|---|---|---|
| 7,558,645 | B2* | 7/2009 | Shiwaku ............... | G05B 19/421 212/274 |
| 8,579,128 | B2* | 11/2013 | Kawabata ................ | B66C 1/28 212/327 |
| 2003/0127410 | A1* | 7/2003 | Ito ............................ | B66C 1/30 212/332 |
| 2005/0098525 | A1* | 5/2005 | Keen .................... | B65H 67/065 212/332 |
| 2006/0180565 | A1* | 8/2006 | Nakao .................... | B66C 13/06 212/332 |
| 2017/0243775 | A1* | 8/2017 | Kobayashi ............... | B61B 3/00 |

FOREIGN PATENT DOCUMENTS

| | | |
|---|---|---|
| JP | 3-28073 U | 3/1991 |
| JP | 2006-013396 A | 1/2006 |
| JP | 2015-196569 A | 11/2015 |

* cited by examiner

*Primary Examiner* — Jason C Smith
(74) *Attorney, Agent, or Firm* — Keating & Bennett, LLP

(57) ABSTRACT

An overhead transport vehicle includes a vibration-proof portion disposed between a belt and a lift device. The vibration-proof portion includes a first connection mechanism disposed on a side where a first load acts in a width direction perpendicular or substantially perpendicular to both a travelling direction and a lifting direction of the lift device, and a second connection mechanism disposed on a side where a second load larger than the first load acts in the width direction, and which has a larger repulsive force than that of the first connection mechanism.

3 Claims, 6 Drawing Sheets

OVERHEAD TRANSPORT VEHICLE

CROSS REFERENCE TO RELATED APPLICATIONS

This application claims the benefit of priority to Japanese Patent Application No. 2016-030177 filed on Feb. 19, 2016, the entire contents of which application are hereby incorporated herein by reference.

BACKGROUND OF THE INVENTION

1. Field of the Invention

The present invention relates to an overhead transport vehicle.

2. Description of the Related Art

As a conventional overhead transport vehicle, for example, a transport vehicle described in JP H03-028073 U is known. An overhead transport vehicle described in JP H03-028073 U includes a travelling vehicle body that travels along a track provided close to a ceiling, and a lift stage that is suspended by a plurality of belts (suspensions) from the travelling vehicle body and is able to grip an article. The lift stage includes a binder that binds the lower ends of the belts, and a biasing mechanism the binder downward. The overhead transport vehicle with this configuration can prevent an error in a mounted position between the plurality of belts, or a tilt of the lift stage due to extension of the belt or the like.

Due to recent diversification of transported articles, it has been required to reduce vibration that is transmitted to an article and to decrease a tilt of an article having a biased center of gravity when the article is suspended.

SUMMARY OF THE INVENTION

Accordingly, preferred embodiments of the present invention provide an overhead transport vehicle capable of preventing a tilt of an article when the article is suspended, while reducing vibration that is transmitted to the article.

An overhead transport vehicle according to a preferred embodiment of the present invention includes: a body capable of travelling along a track; and a grip liftably provided in the body by a plurality of suspensions and capable of gripping an article. The overhead transport vehicle includes a vibration-proof portion disposed between the suspensions and the grip. The vibration-proof portion includes: a first vibration-proof portion disposed on a side, where a first load acts, in a travelling direction of the body or in a width direction perpendicular or substantially perpendicular to both the travelling direction and a lifting direction of the grip; and a second vibration-proof portion disposed on a side, where a second load larger than the first load acts, in the travelling direction or in the width direction and having a larger repulsive force than a repulsive force of the first vibration-proof portion.

In the overhead transport vehicle with this configuration, the vibration-proof portion is disposed between the suspension and the grip, thus enabling reduction in vibration that is transmitted from the grip to the article. Further, the repulsive force of the second vibration-proof portion, which is disposed on the side where a relatively large load of the article acts, is large as compared with the repulsive force of the first vibration-proof portion which is disposed on the side where a relatively small load of the article acts. Therefore, even when the load acted on the grip by the article is biased, such a bias is able to be absorbed by the difference in repulsive force, to prevent a tilt of the article when the article is suspended.

The first vibration-proof portion and the second vibration-proof portion in the overhead transport vehicle according to a preferred embodiment of the present invention may each include a spring or a plurality of spring.

According to the overhead transport vehicle with this configuration, the spring preferably has characteristics of a linear repulsive force or extension with respect to a load, thus enabling easy adjustment of the first vibration-proof portion and the second vibration-proof portion.

In an overhead transport vehicle according to a preferred embodiment of the present invention, the article may be a container to house an object to be housed, or the container housing the object to be housed. A spring constant of the spring or springs in the first vibration-proof portion may be equal or substantially equal to a spring constant of the spring or springs in the second vibration-proof portion. The one or plurality of springs may be pressurized so as to eliminate a tilt of the grip which occurs at the time of lifting the container due to presence of a deviation between a center of gravity of the grip and a center of gravity of the container that is in an empty state and gripped by the grip.

According to the overhead transport vehicle with this configuration, the one or plurality of springs may be pressurized so as to eliminate the tilt of the grip which occurs at the time of lifting the container due to presence of a deviation between the center of gravity of the grip and the center of gravity of the container that is in the empty state (a state where the object to be housed is not housed) and gripped by the grip. Hence it is possible to prevent a tilt of such a container as to act a load that is biased with respect to the center of gravity of the grip when the container is lifted, and also possible to reduce vibration that is transmitted to the container. Further, since the first vibration-proof portion and the second vibration-proof portion include springs with equal or substantially equal spring constants, the respective first and second vibration-proof portions have equal or substantially equal amounts of compression by the load of the object to be housed which is housed into a position where there is no deviation in the center of gravity of the grip. Accordingly, even when the container housing the object to be housed is to be gripped, it is possible to prevent the tilt of the container when the container is suspended, while reducing vibration that is transmitted to the container.

A grip of an overhead transport vehicle according to a preferred embodiment of the present invention may be suspended from the body by, for example, four suspensions, and two of the four suspensions may be connected to one swing that is swingably fixed to the grip.

According to the overhead transport vehicle with this configuration, the grip is in such a state where, while being suspended by four suspensions, the grip is suspended at three points: two connecting portions between the grip and two suspensions not connected to the swing; and one swing portion swingably fixed onto the grip. It is thus possible to obtain an effect similar to a case where the grip is suspended by three suspensions, and the grip is suspended in a more stable state. Further, even when one suspension is cut off for some reason, it is possible to keep the suspended state, and to enhance the safety as compared with the case where the suspension is actually performed by three suspensions.

It is possible to prevent the tilt of the article when the article is suspended, while reducing vibration that is transmitted to the article.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
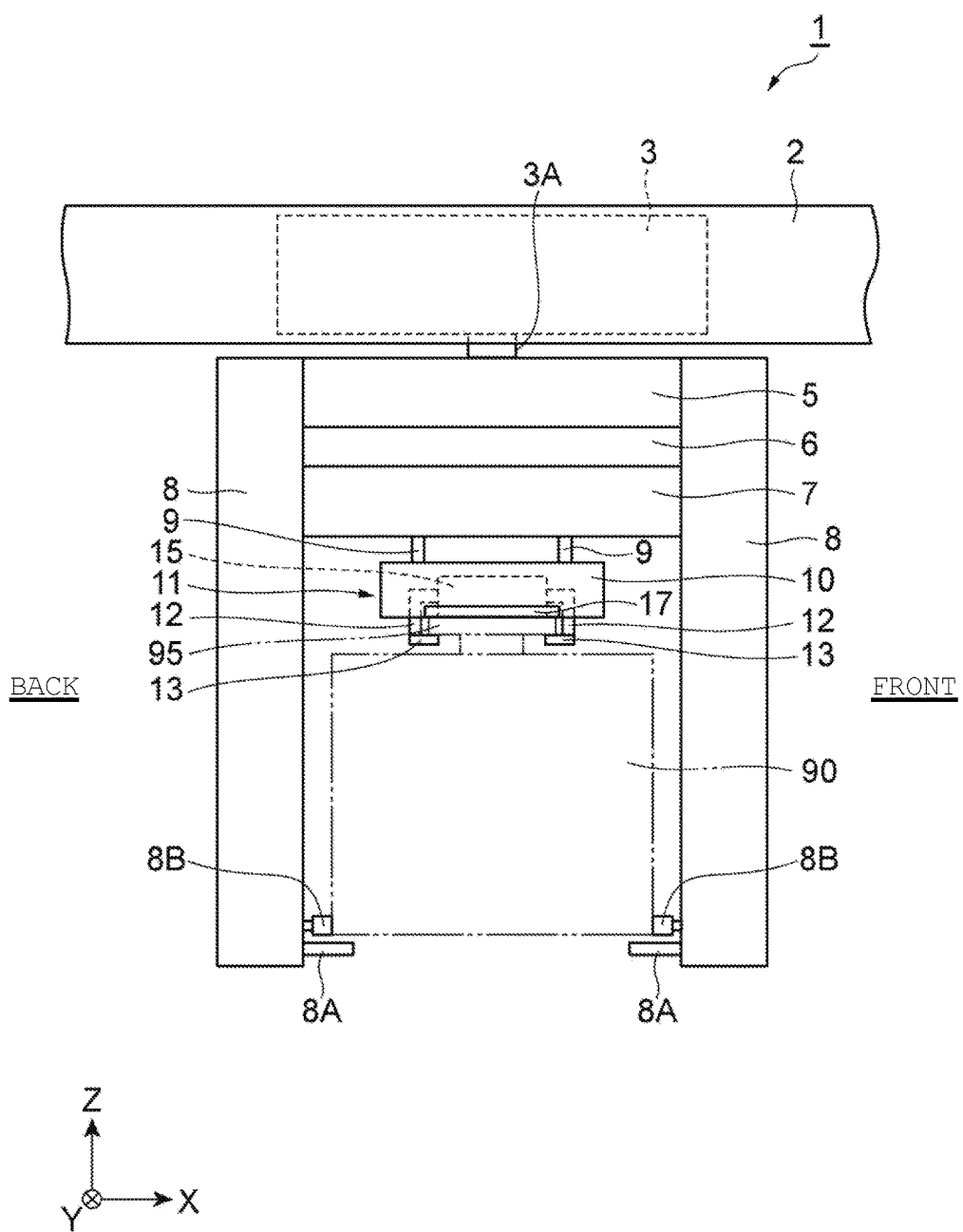
FIG. 1 is a front view illustrating an overhead transport vehicle according to a preferred embodiment of the present invention.

Hereinafter, preferred embodiments of the present invention are described in detail with reference to the drawings. In descriptions of the drawings, the same elements are provided with the same reference numerals, and a repeated description is omitted. A dimensional ratio of the drawing does not necessarily coincide with that in the description.

An overhead transport vehicle 1 illustrated in FIG. 1 travels along a travelling rail 2 provided at a position higher than a floor surface, such as a ceiling of a clean room. The overhead transport vehicle 1, for example, transports a FOUP (Front-Opening Unified Pod) 90, which is an article, between a storage facility and a predetermined load port. The FOUP 90, for example, houses a plurality of semiconductor wafers, reticles, or the like (objects to be housed). The FOUP 90 includes a flange 95 held in the overhead transport vehicle 1. In the following description, for convenience of the description, a lateral direction (an X-axis direction) in FIG. 1 is taken as a longitudinal direction of the overhead transport vehicle 1. A vertical direction in FIG. 1 is taken as a vertical direction (a Z-axis direction) of the overhead transport vehicle 1. A depth direction in FIG. 1 is taken as a lateral direction (a width direction) (a Y-axis direction) of the overhead transport vehicle 1. The X-axis direction, the Y-axis direction, and the Z-axis direction are perpendicular or substantially perpendicular to each other.

Figure 2:
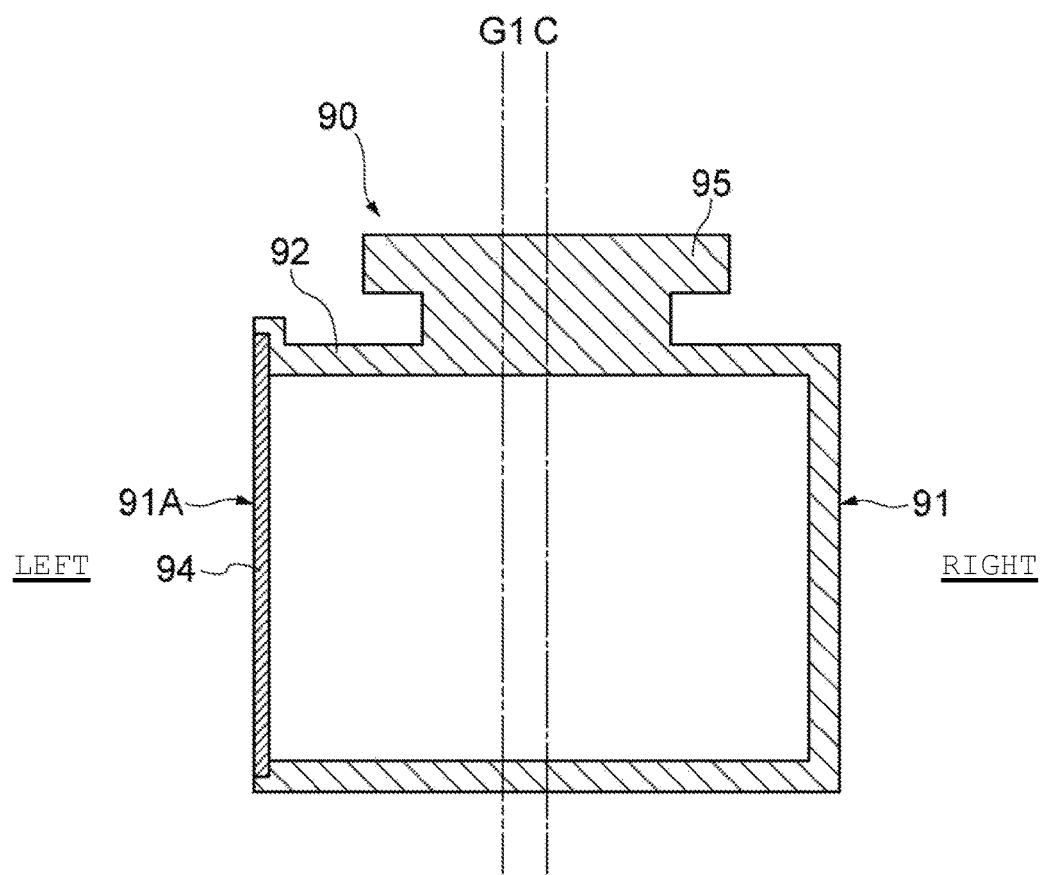
FIG. 2 is a sectional view illustrating a configuration of a FOUP according to a preferred embodiment of an article.

First, a description is given of the FOUP 90 that is transported by the overhead transport vehicle 1. As illustrated in FIG. 2, the FOUP 90 includes a container body 91 with an opening 91A on the front surface side, and a lid 94 mounted on the opening 91A of the container body 91. In a center area or a substantially center area of an upper surface 92 of the container body 91, the flange 95 to lift the FOUP 90 projects upward. Inside the container body 91, a plurality of semiconductor wafer holding units, not illustrated, are provided so that a plurality of semiconductor wafers are able to be housed in the FOUP 90. Further, by mounting the lid 94 on the opening 91A, the inside of the FOUP 90 is able to be held airtight.

In the FOUP 90 in the present preferred embodiment, the lid 94 is fixed with, for example, as a lock mechanism, not illustrated, and thus has a relatively large mass. Hence in a state where the lid 94 is mounted on the container body 91, as illustrated in FIG. 2, a center of gravity G1 in the lateral direction of the FOUP 90 is deviated to the left side (the lid 94 side) in the lateral direction with respect to a center position C of the flange 95. Meanwhile, the semiconductor wafer is housed into the FOUP 90 such that its center of gravity coincides or substantially coincides with the center position C of the flange 95 in the FOUP 90. Therefore, such a bias in the center of gravity of the FOUP 90 is the largest in an empty state where no semiconductor wafer is housed in the FOUP 90, and as the number of semiconductor wafers housed in the FOUP 90 becomes larger, the ratio of the mass of the lid 94 becomes smaller. Thus, the center of gravity of the whole FOUP 90 including the semiconductor wafer becomes closer to the center position C of the flange 95.

Next, a description is given of the overhead transport vehicle 1 that transports the FOUP 90 as thus described. As illustrated in FIG. 1, the overhead transport vehicle 1 includes a travelling driver 3, a horizontal driver (a body) 5, a rotary driver (a body) 6, a lift driver (a body) 7, a lift device (a grip) 10, and a holding device (a grip) 11. The overhead transport vehicle 1 is provided with a pair of covers 8, 8 in the longitudinal direction so as to cover the horizontal driver 5, the rotary driver 6, the lift driver 7, the lift device 10, and the holding device 11. In a state where the lift device 10 has been raised to the rising end, the pair of covers 8, 8 form a space S to house the FOUP 90 below the holding device 11. A fall prevention mechanism 8A prevents fall of the FOUP 90 held in the holding device 11 in the state where the lift device 10 has been raised to the rising end. Further, a swing suppression mechanism 8B suppresses swings of the FOUP 90 that is held in the holding device 11 in the longitudinal direction (the travelling direction) and the lateral direction of the overhead transport vehicle 1.

The travelling driver 3 moves the overhead transport vehicle 1 along the travelling rail 2. The travelling driver 3 is disposed in the travelling rail 2. The travelling driver 3 drives a roller (not illustrated) that travels on the travelling rail 2. The lower portion of the travelling driver 3 is connected with the horizontal driver 5 via a shaft 3A. The horizontal driver 5 moves the rotary driver 6, the lift driver 7, and the lift device 10 in a direction perpendicular or substantially perpendicular to an extending direction of the travelling rail 2 (in the lateral direction) within a horizontal plane. The rotary driver 6 rotates the lift driver 7 and the lift device 10 within the horizontal plane. The lift driver 7 raises and lowers the lift device 10 by feeding and taking up four belts (suspensions). For the belt in the lift driver 7, an appropriate suspension such as a wire or a rope may be used.

The lift device 10 in the present preferred embodiment is liftable by the lift driver 7, and defines and functions as a lift stage in the overhead transport vehicle 1. The lift device 10 includes a base 10A and a case 10B. The holding device 11 holds the FOUP 90. The holding device 11 includes a pair of arms 12, 12 in an L-shape, hands 13, 13 fixed to the respective arms 12, 12, and an opening-closing mechanism 15 that opens and closes the pair of arms 12, 12.

The pair of arms 12, 12 are connected to the opening-closing mechanism 15. The opening-closing mechanism 15 moves the pair of arms 12, 12 in a direction approaching each other and a direction moving away from each other. By the operation of the opening-closing mechanism 15, the pair of arms 12, 12 move forward and backward in the longitudinal direction. This leads to opening and closing of a pair of hands 13, 13 fixed to the arms 12, 12. In the present preferred embodiment, when the pair of hands 13, 13 are in an open state, a height position of the holding device 11 (the lift device 10) is adjusted such that the holding surface of the hand 13 is below a height of the lower surface of the flange 95. By the pair of hands 13, 13 shifting from this state to a closed state, the holding surfaces of the hands 13, 13 move downward below the lower surface of the flange 95, and by raising the lift device 10 in this state, the flange 95 is held (gripped) by the pair of hands 13, 13 to support the FOUP 90.

Figure 3:
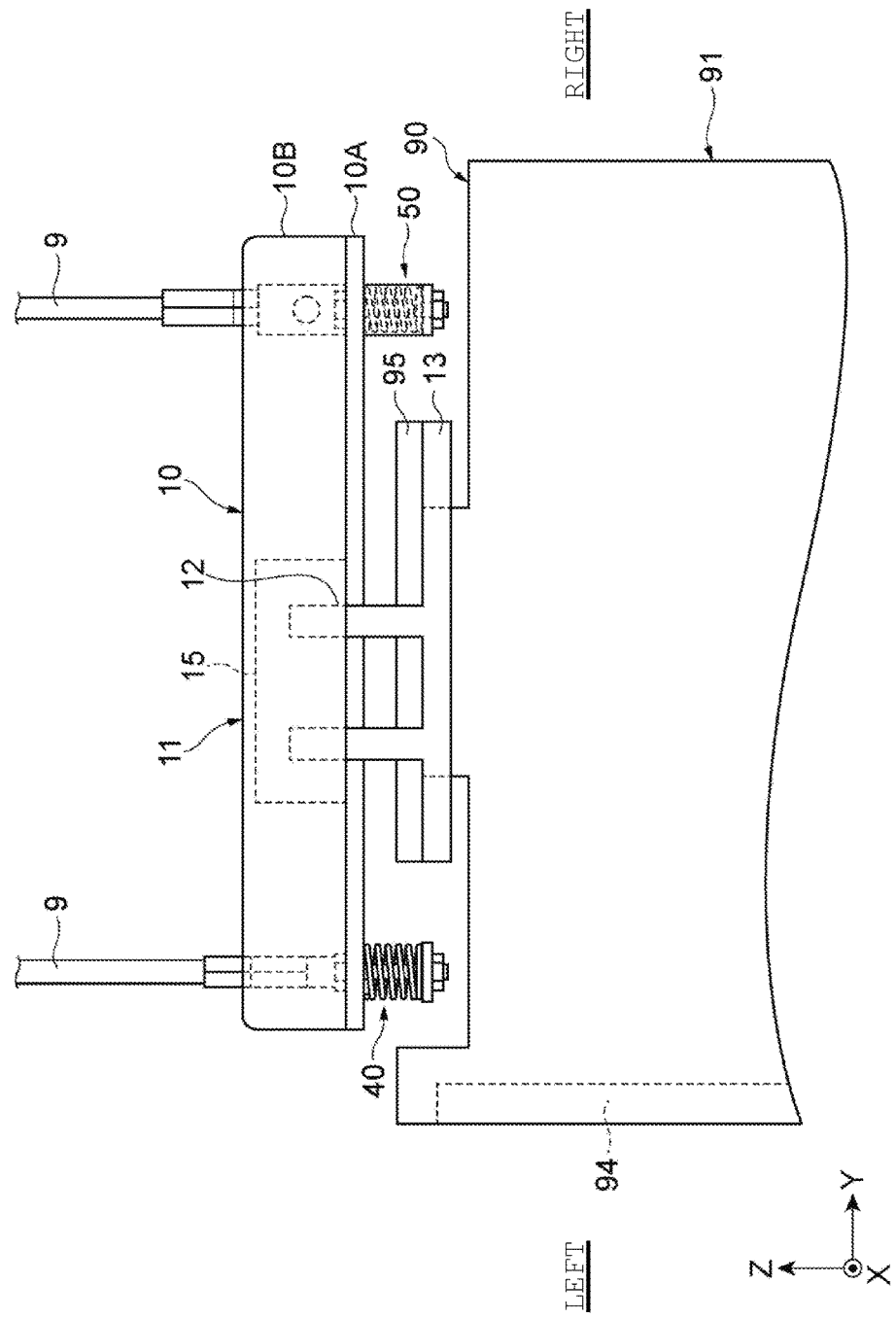
FIG. 3 is a side view of a transport device of FIG. 1 as seen from a front direction.
Figure 4:
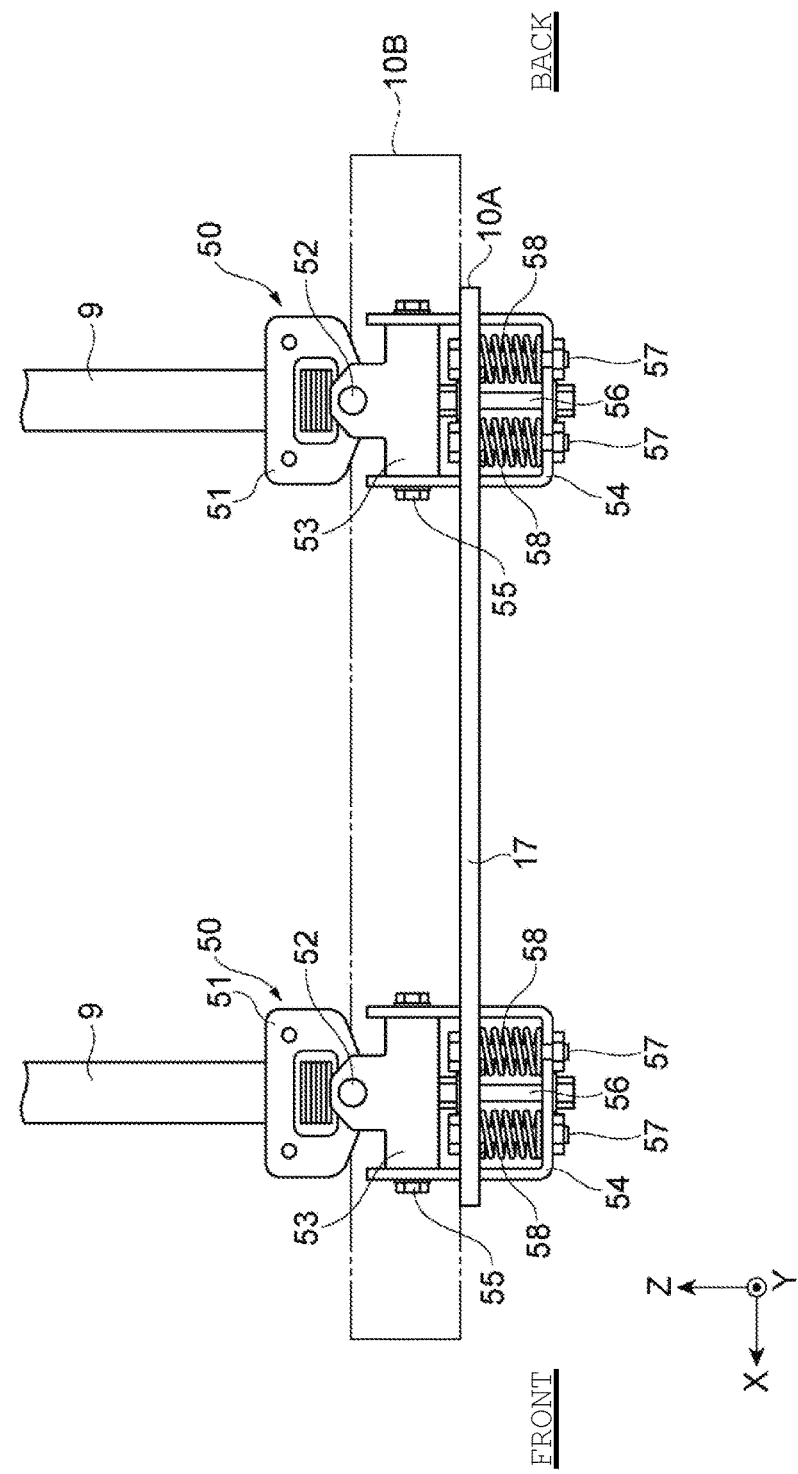
FIG. 4 is a front view illustrating a schematic configuration of a second connection mechanism.

As illustrated in FIGS. 3 and 4, a first connection mechanism (a first vibration-proof portion) 50 and a second connection mechanism (a second vibration-proof portion) 40 are mechanism to connect a belt 9 and the holding device 11. In the present preferred embodiment, the first connection mechanism 50 and the second connection mechanism 40 are disposed between the belt 9 and the base 10A where the holding device 11 is disposed. In other words, the belt 9 is connected to the base 10A where the holding device 11 is disposed, via the first connection mechanism 50 or the second connection mechanism 40.

As illustrated in FIG. 3, the first connection mechanism 50 is provided on the right side in the lateral direction of the lift device 10. Further, the first connection mechanism 50 is disposed at two points in the longitudinal direction as illustrated in FIG. 4. The first connection mechanism 50 includes a connector 51, a swing 53, a first body 54, a second body 56, first shifters 57, 57, and first springs (vibration-proof portions, springs) 58, 58.

The connector 51 is connected to the belt 9. The swing is connected to the connector 51 while extending in the longitudinal direction. The swing 53 is rotatably connected via a first pin 52. The first body 54 is U-shaped or substantially U-shaped with an open upper end, and includes a bottom that is flat in a horizontal direction (longitudinal and lateral directions). The upper end of the first body 54 is connected to both ends of the swing 53 by bolts 55. The second body 56 provides connection between central or substantially central regions of the swing 53 and the first body 54.

The pair of first shifters 57, 57 are rod-shaped and extend upward from the first body 54, and disposed so as to sandwich the second body 56. The pair of first springs 58, 58 are compression coil springs having a predetermined spring constant, and respectively inserted through the pair of first shifters 57, 57. The upper ends of the pair of first springs 58, 58 are disposed with the base 10A in a contact state. That is, preferably four first springs 58 of the first connection mechanism 50 are disposed between the base 10A and the belt 9, for example. The first spring 58 presses the base 10A upward which is a direction opposite to the gripping direction (downward in the vertical direction) of the FOUP 90. Note that a predetermined spring constant is described in detail later.

Figure 5:
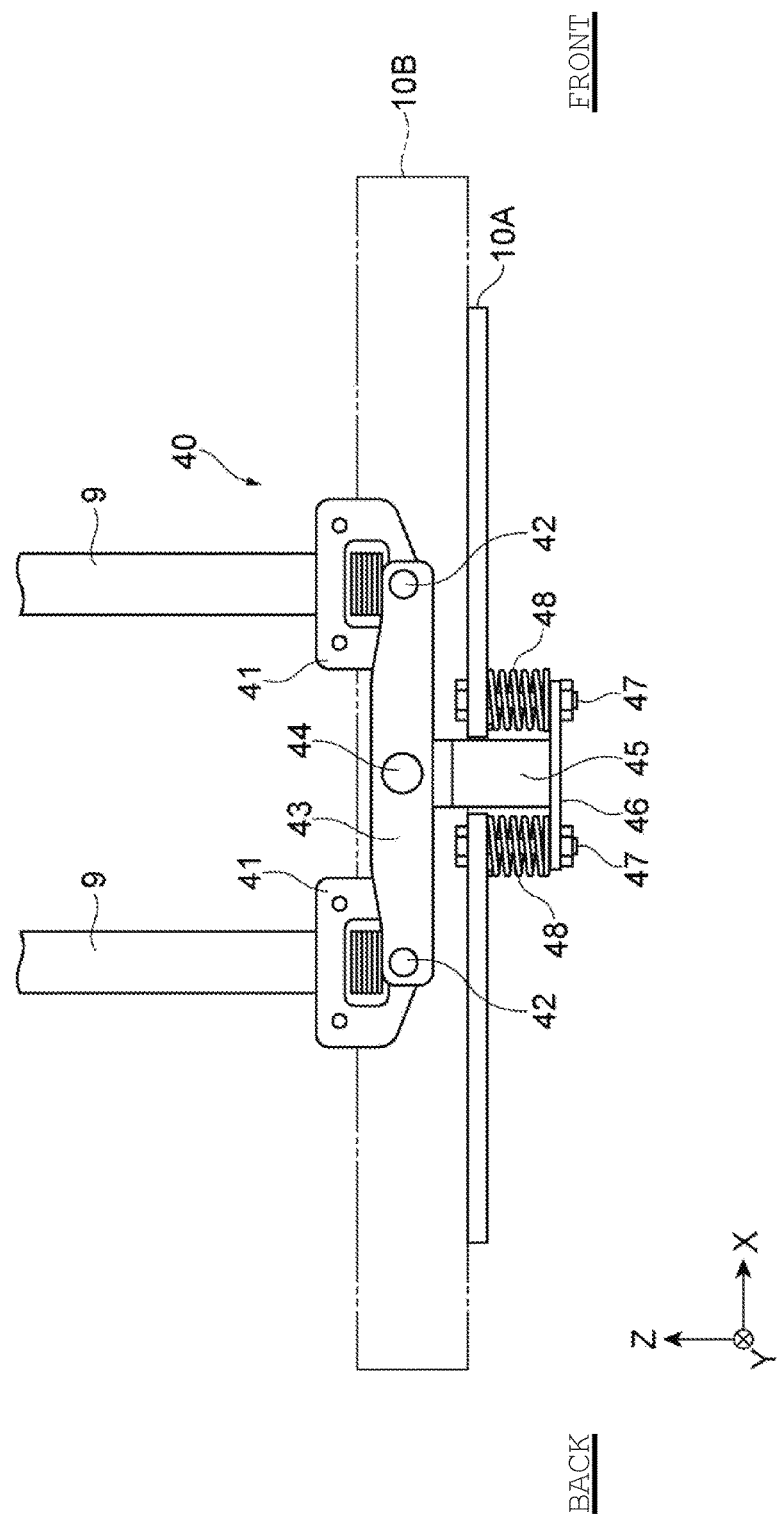
FIG. 5 is a front view illustrating a schematic configuration of a first connection mechanism.

As illustrated in FIG. 3, the second connection mechanism 40 is provided on the left side in the lateral direction of the lift device 10. The second connection mechanism 40 is disposed in the vicinity of the central region in the longitudinal direction as illustrated in FIG. 5. The second connection mechanism 40 includes connectors 41, 41, a swing (swing) 43, a third body 45, a fourth body 46, second shifters 47, 47, and second springs (vibration-proof portions, springs) 48, 48.

The connectors 41, 41 are connected to the belts 9, 9. The swing 43 provides connection between the pair of connectors 41, 41 and the third body 45. The pair of connectors 41, 41 are rotatably connected with the swing 43 via a pair of third pins 42, 42. The swing 43 and the third body 45 are connected via a fourth pin 44. The fourth body 46 is a plate connected to the lower end of the third body 45, and extends in a horizontal direction (the longitudinal and lateral directions).

The pair of second shifters 47, 47 are rod-shaped and extend upward from the fourth body 46, and disposed so as to sandwich the third body 45. The pair of second springs 48, 48 are compression coil springs having a predetermined spring constant which is the same spring constant as that of the pair of first springs 58, 58, and respectively inserted through the pair of second shifters 47, 47. On the upper ends of the pair of second shifters 47, 47, the base 10A is disposed in a contact state. That is, two second springs 48 of the second connection mechanism 40 are disposed between the base 10A and the belt 9. The second spring 48 presses the base 10A upward which is a direction opposite to the gripping direction (downward in the vertical direction) of the FOUP 90. Note that a predetermined spring constant is described in detail later.

Figure 6A:
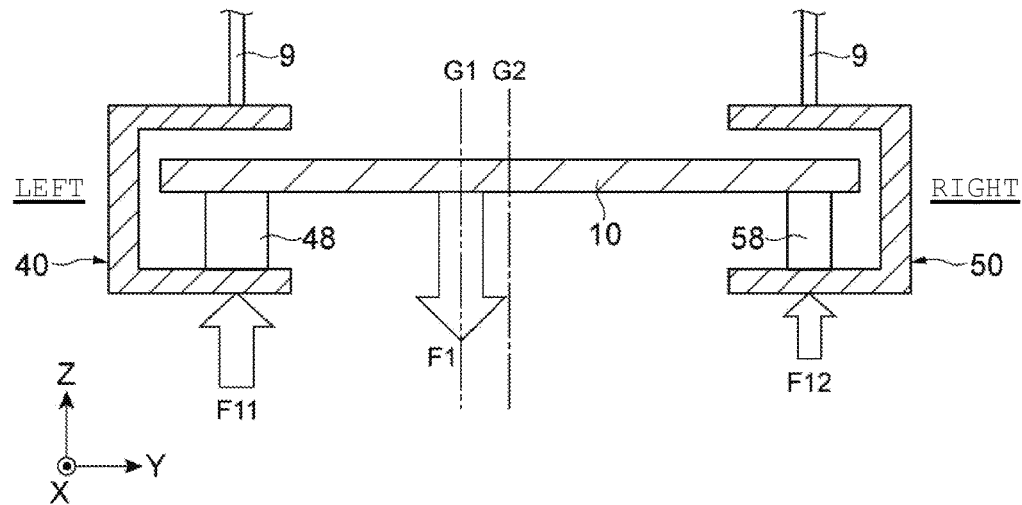
FIG. 6A is a view illustrating a state of a load when a FOUP in an empty state is lifted.

As illustrated in FIGS. 1 and 3, the overhead transport vehicle 1 transports the FOUP 90 with the lid 94 turned to the left side which is one of the right and left direction (the lateral direction) perpendicular or substantially perpendicular to the travelling direction. At this time, as illustrated in FIG. 6A, there is a "deviation" between the center of gravity G1 of the FOUP 90 in the state of being gripped by the hands 13, 13 and a center of gravity G2 of the lift device 10 (a center of gravity of four connections of the lift device 10 on four belts 9). Due to such a state, a load F, which is received in the lift device 10 when the hands 13, 13 grip and lift the FOUP 90, is different between on the right side and on the left side in the lateral direction of the lift device 10. Specifically, a load (a second load) received on the left side (the side where the second load acts) in the lateral direction (the width direction perpendicular or substantially perpendicular to both the travelling direction and the lifting direction of the grip) becomes larger than a load (a first load) received on the right side (the side where the first load acts). Thus, normally, when the hands 13, 13 grip and lift the FOUP 90, the lift device 10 suspended by the belts 9 tilts in the lateral direction.

Accordingly, in the overhead transport vehicle 1 of the present preferred embodiment, a repulsive force F11 of the second connection mechanism 40 disposed on the left side in the lateral direction is adjusted to be larger than repulsive force F12 of the first connection mechanism 50 disposed on the right side in the lateral direction. Specifically, in a state where the FOUP 90 is not gripped, the repulsive force of the second connection mechanism 40 which is generated by the second spring 48 is structured to be larger than the repulsive force of the first connection mechanism which is generated by the first spring 58. That is, the foregoing load difference is able to be absorbed by the difference in repulsive force.

The above repulsive force is able to be adjusted not only by characteristics of materials and the like of the spring itself of each of the first spring 58 and the second spring 48, but also by pressure applied to the first spring 58 and the second spring 48. In the present preferred embodiment, the characteristics of the first spring 58 and the second spring 48 are respectively selected such that the spring constant of the first connection mechanism 50 as a whole is equal or substantially equal to the spring constant of the second connection mechanism 40 as a whole, and at least one of the first spring 58 and the second spring 48 is pressurized (compressed) so as to eliminate the tilt of the FOUP 90 which occurs due to presence of a deviation between the center of gravity G1 of the FOUP 90 in the state of being gripped by the hands 13, 13 and the center of gravity G2 of the lift device 10.

In the present preferred embodiment, the first spring 58 and the second spring 48 are pressurized so as to eliminate the tilt of the FOUP 90 which occurs due to presence of a deviation between the center of gravity G1 of the FOUP 90 gripped by the hands 13, 13 and the center of gravity G2 in the lift device 10. Specifically, the first spring 58 and the second spring 48 are pressurized such that the tilt of the lift device 10 comes into a horizontal state (such that a tilt of the bottom surface of the FOUP 90 is eliminated) when the FOUP 90 in the empty state is lifted. Pressurizing the first spring 58 and the second spring 48 to bring the lift device 10 into such a state as above prevents the lift device 10 from being tilted when the hands 13, 13 lift the empty FOUP 90.

Figure 6B:
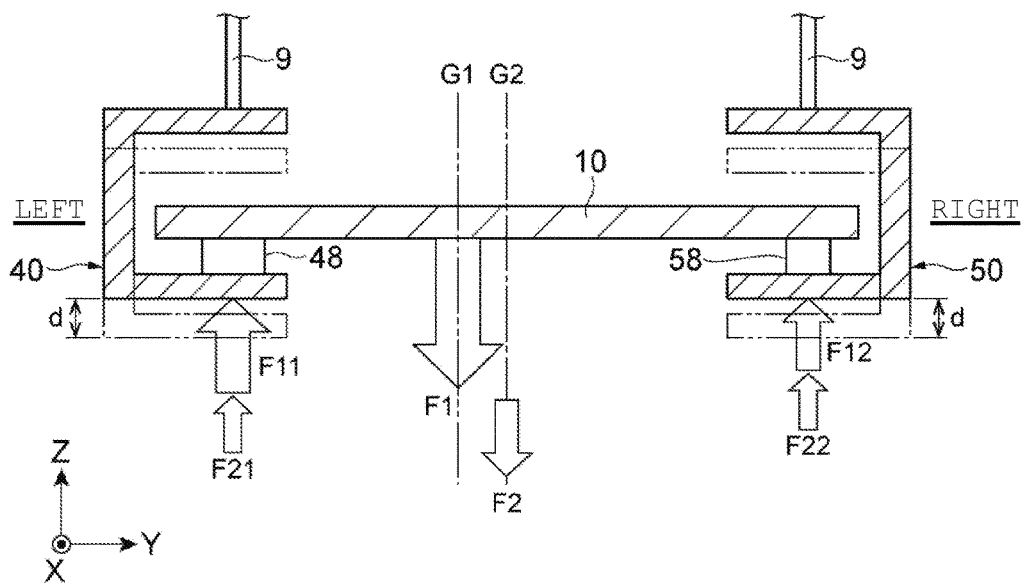
FIG. 6B is a view illustrating a state of a load when a FOUP housing semiconductor wafers, reticles, or the like is lifted.

Meanwhile, the semiconductor wafers are each housed into the FOUP 90 at a position having no large deviation with respect to the center of gravity G2 in the lift device 10. That is, there is almost no deviation between a center of gravity G3 of one or more semiconductor wafers that are housed into the FOUP 90 and the center of gravity G2 in the lift device 10. Therefore, as illustrated in FIG. 6B, a load F2 generated by the semiconductor wafers housed into the FOUP 90 uniformly acts on the first spring 58 and the second spring 48 almost irrespective of the number of semiconductor wafers. As described above, in the present preferred embodiment, the characteristics of the first spring 58 and the second spring 48 are respectively selected such that the spring constant of the first connection mechanism 50 as a whole is equal or substantially equal to the spring constant of the second connection mechanism 40 as a whole. Hence in a state where the FOUP 90 has been lifted, each of the repulsive force F21, F22 of the same strength is applied. That is, the first spring 58 and the second spring 48 are equally compressed or substantially equally compressed (a compression amount d). Thus, even when the FOUP 90 housing the semiconductor wafers is suspended, the lift device 10 is not tilted and is kept in the horizontal state.

In the overhead transport vehicle 1 of the above preferred embodiment, since each of the first connection mechanism 50 and the second connection mechanism 40 as the vibration-proof portion is disposed between the belt 9 and the lift device 10, it is possible to reduce vibration that is transmitted from the belt 9 to the FOUP 90. Further, the repulsive force of the second connection mechanism 40 disposed on the side where a relatively large load of the FOUP 90 acts, is large as compared with the repulsive force of the first connection mechanism 50 disposed on the side where a relatively small load of the FOUP 90 acts. Therefore, even when the load acted on the lift device 10 by the FOUP 90 is biased, such a bias is able to be absorbed by the difference in repulsive force, to prevent the tilt of the FOUP 90 when the FOUP 90 is suspended.

The first connection mechanism 50 and the second connection mechanism 40 in the overhead transport vehicle 1 of the above preferred embodiment include one or a plurality of springs (the first spring 58 and the second spring 48). The spring shows linear characteristics of the repulsive force and extension with respect to a load, thus facilitating adjustment of pressurization and/or selection of characteristics, and the like of the first spring 58 and the second spring 48 which are used to eliminate the bias of the load in the lateral direction.

In the overhead transport vehicle 1 of the above preferred embodiment, one or a plurality of first springs 58 and second springs 48 are pressurized so as to eliminate the tilt of the lift device 10, which occurs at the time of lifting the FOUP 90 due to presence of a deviation between the center of gravity G1 of the FOUP 90 that is in the empty state and lifted by the lift device 10 and the center of gravity G2 of the lift device 10. Hence it is possible to prevent the tilt of the FOUP 90 at the time of lifting such a FOUP 90 as to act a load that is biased with respect to the center of gravity G2 of the lift device 10. Further, the spring constant of the first connection mechanism 50 is equal or substantially equal to the spring constant of the second connection mechanism 40. Accordingly, even when the FOUP housing the semiconductor wafers is to be gripped, it is possible to prevent the tilt of the FOUP 90 when the FOUP 90 lifted, while reducing vibration that is transmitted to the FOUP 90.

In the overhead transport vehicle 1 of the above preferred embodiment, the lift device 10 is in such a state where, while being suspended by four belts 9, the lift device 10 is suspended preferably at three points: two connecting portions between the lift device 10 and two belts 9 connected to the first connection mechanism 50 (and not connected to the swing 43 in the second connection mechanism 40); and one fourth pin 44 swingably fixed in the second connection mechanism 40. It is thus possible to obtain an effect similar to the case of suspension by three belts 9, and the lift device 10 is able to be suspended in a more stable state. Further, even when one belt 9 is cut off for some reason, it is possible to maintain the suspended state, and the safety is able to be enhanced as compared with the case where the suspension is actually performed by three belts 9.

Although preferred embodiments has been described above, the present invention is not limited to the above preferred embodiments, and various changes can be made in a range not deviating from the gist of the present invention.

In the above preferred embodiments, the description has been given of the example where the first spring 58 and the second spring 48 are pressurized such that the tilt of the lift device 10 comes into the horizontal state (such that the tilt of the FOUP 90 is eliminated) at the time of lifting the FOUP 90 in the empty state. However, the present invention is not limited thereto. For example, the first spring 58 and the second spring 48 may be pressurized such that the lift device 10 comes into the horizontal state (such that the tilt of the FOUP 90 is eliminated) at the time of lifting the FOUP 90 that is fully loaded with the semiconductor wafers. Further, the first spring 58 and the second spring 48 are pressurized such that the lift device 10 comes into the horizontal state (such that the tilt of the FOUP 90 is eliminated) at the time of lifting the FOUP 90 fully loaded with the semiconductor wafers in a predetermined weight.

In the above preferred embodiment, the description has been given of the example where the belt 9 is connected to each of the connector 51 in the first connection mechanism 50 and the connector 41 in the second connection mechanism 40, namely, the example where the lift device 10 is preferably suspended by four belts 9, for example. However, the present invention is not limited thereto. For example, as illustrated in FIG. 5, in the second connection mechanism 40, it may be configured such that the belt 9 is connected to the fourth pin 44 instead of the connector 41, and the lift device 10 is thus suspended by three belts 9. With this configuration, it is possible to suspend the lift device 10 in a more stable state.

In the above preferred embodiments or alternative preferred embodiment, the description has been given of the example where the second connection mechanism 40 includes two second springs 48 is disposed on the left side in the lateral direction of the lift device 10, and two first connection mechanisms 50, each include two first springs 58, are disposed on the right side in the lateral direction of the lift device 10. However, the present invention is not limited thereto. For example, the second connection mechanism 40 may be disposed on the right side in the lateral direction of the lift device 10, and two first connection mechanisms 50 may be disposed on the left side in the lateral direction of the lift device 10. Further, the second connection mechanism 40 may be disposed on each side in the lateral direction of the lift device 10, or two first connection mechanisms 50 may be disposed on each side in the lateral direction of the lift device 10. It may simply be constructed such that a biasing structure having a large repulsive force is disposed on the side where a large load acts in the lateral direction, and the number of springs, the characteristics of the spring, and the like, can be in any states.

In the configuration in which the overhead transport vehicle 1 transports the FOUP 90 with the lid 94 turned to one side in the longitudinal direction (the travelling direction), it may simply be structured such that a biasing structure having a large repulsive force is disposed on the side where a large load acts not in the lateral direction but in the longitudinal direction.

In place of or in addition to the first spring 58 or the second spring 48 in the above preferred embodiment or an alternative preferred embodiment, for example, a gelled elastic body formed of silicone resin or the like may be provided. Even in this case, it is possible to absorb vibration and impact in a similar manner to the case of disposing the first spring 58 or the second spring 48.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An overhead transport vehicle comprising:
    a body capable of travelling along a track; and
    a grip liftably provided in the body by a plurality of suspensions and capable of gripping an article; wherein
    the overhead transport vehicle includes a vibration-proof portion disposed between the plurality of suspensions and the grip;
    the vibration-proof portion includes:
        a first vibration-proof portion disposed on a side, where a first load acts, in a travelling direction of the body or in a width direction perpendicular or substantially perpendicular to both the travelling direction and a lifting direction of the grip; and
        a second vibration-proof portion disposed on a side, where a second load larger than the first load acts, in the travelling direction or in the width direction and having a larger repulsive force than a repulsive force of the first vibration-proof portion; and
    the first vibration-proof portion and the second vibration-proof portion each includes a spring or a plurality of springs.

2. The overhead transport vehicle according to claim 1, wherein the article is a container to house an object to be housed, or the container housing the object to be housed;
    a spring constant of the spring or the plurality of springs in the first vibration-proof portion is equal or substantially equal to a spring constant of the spring or the plurality of springs in the second vibration-proof portion; and
    the spring or the plurality of springs in the first vibration-proof portion and the spring or the plurality of springs in the second vibration-proof portion are pressurized so as to eliminate a tilt of the grip which occurs at a time of lifting the container due to presence of a deviation between a center of gravity of the grip and a center of gravity of the container that is in an empty state and gripped by the grip.

3. The overhead transport vehicle according to claim 1, wherein
    the grip is suspended from the body by four of the suspensions; and
    two of the four suspensions are connected to one swing that is swingably fixed to the grip.

* * * * *